United States Patent
Chen et al.

(10) Patent No.: US 7,413,912 B2
(45) Date of Patent: Aug. 19, 2008

(54) MICROSENSOR WITH FERROELECTRIC MATERIAL AND METHOD FOR FABRICATING THE SAME

(75) Inventors: Jyh-Shin Chen, Hsinchu (TW); Der-Chi Shye, Bade (TW); Meng-Wei Kuo, Kaohsiung (TW); Ming-Hua Shiao, Hsin-Chu (TW); Jiann-Shium Kao, Hsin-Chu (TW); Huang-Chung Cheng, Hsinchu (TW); Bi-Shiou Chiou, Hsinchu (TW)

(73) Assignee: Instrument Technology Research Center, National Applied Research Laboratories (TW)

( * ) Notice: Subject to any disclaimer, the term of this patent is extended or adjusted under 35 U.S.C. 154(b) by 234 days.

(21) Appl. No.: 11/126,459

(22) Filed: May 11, 2005

(65) Prior Publication Data

US 2006/0258040 A1 Nov. 16, 2006

(51) Int. Cl.
*H01L 21/00* (2006.01)
(52) U.S. Cl. .................. 438/3; 257/E21.208
(58) Field of Classification Search .......... 438/3; 257/E21.663
See application file for complete search history.

(56) References Cited

U.S. PATENT DOCUMENTS

| | | | | |
|---|---|---|---|---|
| 3,934,058 A | * | 1/1976 | Seebacher | 427/103 |
| 5,241,741 A | * | 9/1993 | Sugaya | 29/612 |
| 5,252,498 A | * | 10/1993 | Yamazaki | 438/105 |
| 5,310,990 A | * | 5/1994 | Russell et al. | 219/121.69 |
| 5,316,973 A | * | 5/1994 | Wang et al. | 438/3 |
| 5,453,908 A | * | 9/1995 | Tsu et al. | 361/321.5 |
| 5,566,046 A | * | 10/1996 | Kulwicki | 361/321.5 |
| 5,796,079 A | * | 8/1998 | Kim et al. | 219/678 |
| 5,818,043 A | * | 10/1998 | Buchy et al. | 250/332 |
| 5,874,379 A | * | 2/1999 | Joo et al. | 501/138 |
| 6,210,625 B1 | * | 4/2001 | Matsushita et al. | 264/610 |
| 6,737,282 B2 | * | 5/2004 | Cheng et al. | 438/3 |
| 2004/0175585 A1 | * | 9/2004 | Zou et al. | 428/469 |
| 2004/0217402 A1 | * | 11/2004 | Andideh | 257/296 |
| 2005/0015175 A1 | * | 1/2005 | Huang | 700/121 |
| 2006/0082423 A1 | * | 4/2006 | Kim et al. | 333/158 |
| 2007/0202036 A1 | * | 8/2007 | Jongen et al. | 423/593.1 |

FOREIGN PATENT DOCUMENTS

JP 02117090 A * 5/1990

* cited by examiner

*Primary Examiner*—Bradley W. Baumeister
*Assistant Examiner*—Igwe U. Anya
(74) *Attorney, Agent, or Firm*—The Webb Law Firm

(57) ABSTRACT

A microsensor fabricated with a ferroelectric material and a fabrication method therefor are provided. The microsensor includes a support, an insulating layer on the support, a first electrode on the insulating layer, a ferroelectric layer having at least a metal on the insulating layer and the first electrode, and at least a second electrode on the ferroelectric layer.

10 Claims, 3 Drawing Sheets

MICROSENSOR WITH FERROELECTRIC MATERIAL AND METHOD FOR FABRICATING THE SAME

FIELD OF THE INVENTION

The present invention relates to a microsensor and a fabrication method therefor, in particular to a micro thermistor processed by means of the micro-electro-mechanical system (MEMS) and a relevant fabrication method therefor.

BACKGROUND OF THE INVENTION

With the requirements of improving integration, miniaturization, high frequency and fast response for the electronic device as well as the demand for IR (infrared rays) image arrays, it is imperative for the sensor device to be fabricated as a micro-system. Therefore, techniques for the nano/micro-electro-mechanical system (NEMS/MEMS) are increasingly improved on the mentioned purpose.

Regarding the conventional micro-thermistor (thermal resistor), such a thermal resistance device is advantageous for its low cost and its ability for being available at a room temperature and for being fabricated as a non-contact device. In comparison with the capacitance thermaistor, the thermal resistance device is also superior in the response speed. Therefore, people not only in the academia but also in the industrial have done a great effect on the fabrication of micro-thermistor arrays.

The most principal factor for dominating a thermistor is the temperature coefficient of resistance (TCR). The definition of TCR is given as TCR=dR/(dT×R), wherein R represents the resistance of the thermistor, and dR and dT represent the differential of the resistance and the time period, respectively.

Depending on the magnitude of TCR, there are two types of typical thermal resistance materials which are commonly used in the thermistor, including a PTCR (positive TCR) material and an NTCR (negative TCR) material. The PTCR material always has a TCR value of only about +2%, while the TCR value of the NTCR material is always larger. However, the NTCR material may damage the thermistor due to the effect of thermal runaway, and hence a complicated feedback circuit for compensation is always an essential portion therein which is disadvantageous for the thermistor to be miniaturized and integrated. Besides, it is also necessary for the thermistor to possess a larger TCR value while it is miniaturized. Therefore, it has become a serious issue for the skilled person that how to obtain a PTCR material with a high TCR value.

Please refer to FIG. 1, which is a side view schematically illustrating a conventional micro-thermistor device according to the prior art, in which the micro-thermistor device is fabricated by means of a typical surface micromachining technique. The micro-thermistor device 1 includes a thermistor 10 which is fabricated from a suspended flake and is so-called a sensing pixel. Each sensing pixel may detect infrared rays from a heat source and be further heated thereby, and the resistance of the sensing pixel is varied therewith, accordingly. While the resistance variation resulting from the heat is detected, the temperature or the heating state of the heat source is derivable from a pre-constructed database. The thermistor 10 is fabricated as a suspended structure to prevent the gathered heat from being affected by the heat conduction and from dissipating in a short time. Furthermore, the specific detectivity and the responsibility are also critical factors for the thermistor 10 and can be optimized by means of the improved fabrication Ferroelectric materials with a perovskite structure, such as $LiTaO_3$, $BaTiO_3$ and $(Ba, Sr)TiO_3$, are commonly used in the bolometer application, while the thin film microsensor mainly adopts a pyroelectric element or a thermal capacitor. Such a thin film micro thermistor is disadvantageous for its slow response, large interference and poor signal detectivity.

By contrast, the mentioned drawbacks might be overcome by the micro-thermistor array fabricated from a high PTCR material. For example, the polycrystalline strontium-barium titanate $(Ba, Sr)TiO_3$, i.e. the BST material, exhibits an extremely high PTCR at the curie temperature $T_C$. More specifically, the PTCR is almost higher than 20% which is extremely higher than that of the conventional metallic PTCR materials, so that the polycrystalline BST material performs as an excellent material for the themistor. Furthermore, BST is a semi-insulating material with a band gap ranged in 2.5~3.5 eV, which is convertible into a semiconducting material exhibiting a high electric conductivity by the dopant implementation, and thus the BST material is suitable for the thermistor application.

Nowadays, relevant techniques and efforts are developed on bulks or powders of the perovskite-type material and the PTCR mechanism thereof is known as the Heywang model. At the $T_C$ temperature, the perovskite-type material would transform from the ferroelectric phase to the paraelectric phase, which results in a rapid variation of the polarization thereof. While the temperature is increased, the depletion region on the grain boundary in the perovskite-type material may enlarge rapidly, so as to equalize the trapping charges thereon, and the resistivity of the perovskite-type material is increased due to the increment of the boundary potential resulted therefrom.

As for the thin film of the perovskite-type material, however, the TCR value thereof may be dramatically reduced by the inevitable interface stress even to a range of NTCR. Therefore, it is an important issue for the thin film BST-thermistor that how the interface stress could be reduced and how the TCR value could be enhanced.

On the other hand, a common scheme for enhancing the PTCR of the BST material is by doping some hetero-elements such as chromium Cr and manganese Mn therein and followed by a step of being sintered at a temperature higher than 1000° C. Such a scheme is disadvantageous because the thermal stress resulting from the high temperature would seriously damage the film property and makes it impossible to drive-in the dopants into the film material. Moreover, with respect to the physical coating techniques, it is also difficult to perform Cr or Mn pre-doping in the BST target since the melting point as well as the molecule bonding of the metal Cr or Mn is hugely different from that of the ceramic BST.

In order to overcome the above drawbacks in the prior art, the present invention provides a novel microsensor with a ferroelectric material and a novel fabrication method. The provided microsensor is processed by means of the micro-electro-mechanical system (MEMS) in which the dopant Cr or Mn is driven in the BST film via a microwave post-treatment or an excimer laser annealing treatment so as to fabricate a Cr-doped or an Mn-doped BST film for enhancing the TCR thereof.

SUMMARY OF THE INVENTION

In accordance with a first aspect of the present invention, a microsensor fabricated with a ferroelectric material is provided. The microsensor includes a support, an insulating layer on the support, a first electrode on the insulating layer, a ferroelectric layer having at least a metal on the insulating layer and the first electrode, and at least a second electrode on the ferroelectric layer.

Preferably, the metal is driven in the ferroelectric layer.

Preferably, the support includes a silicon.

Preferably, the insulating layer includes one of a silicon oxide and a silicon nitride.

Preferably, the first electrode and the second electrode include one of an electrically conductive ceramic material and a metal with a relatively high melting-point.

Preferably, the metal with the relatively high melting-point is a platinum.

Preferably, the ferroelectric layer is a polycrystalline barium strontium titanate (BST) layer.

Preferably, the metal comprises one of a chromium and a manganese.

Preferably, the microsensor further includes a passivation layer on the ferroelectric layer.

In accordance with a second aspect of the present invention, a microsensor fabricated with a ferroelectric material is provided. The microsensor includes a support, an insulating layer on the support, and a thin film resistor made of a ferroelectric material on the insulating layer.

Preferably, the thin film resistor further includes a first electrode on the insulating layer, a ferroelectric layer having at least a metal on the insulating layer and the first electrode, and at least a second electrode on the ferroelectric layer.

Preferably, the metal is driven in the ferroelectric layer.

In accordance with a third aspect of the present invention, a method for fabricating a microsensor is provided. The microsensor is fabricated with a ferroelectric material and the provided method includes steps of (a) providing a substrate, (b) forming an insulating layer on the substrate, (c) forming a first electrode on the insulating layer, (d) forming a ferroelectric layer on the first electrode and the insulating layer, (e) providing at least a metal in the ferroelectric layer, (f) forming at least a second electrode on the ferroelectric layer, and (g) transforming the substrate into a support.

Preferably, in the step (e), the metal is provided in the ferroelectric layer via a heat treatment.

Preferably, the heat treatment is one of a microwave post-treatment and an excimer laser annealing treatment.

Preferably, the method further includes a step (f1) of forming a passivation layer on the ferroelectric layer.

Preferably, the substrate includes a silicon.

Preferably, the insulating layer includes one of a silicon oxide and a silicon nitride.

Preferably, the first electrode and the second electrode include one of an electrically conductive ceramic material and a metal with a relatively high melting-point.

Preferably, the metal with the relatively high melting-point is a platinum.

Preferably, the ferroelectric layer is a polycrystalline barium strontium titanate (BST) layer.

Preferably, the metal includes one of a chromium and a manganese.

In accordance with a fourth aspect of the present invention, a method for fabricating a microsensor is provided. The method includes steps of (a) providing a substrate, (b) forming an insulating layer on the substrate, (c) forming a thin film resistor of a ferroelectric material on the insulating layer, and (d) transforming the substrate into a support.

Preferably, the step (c) further includes steps of (c1) forming a first electrode on the insulating layer, (c2) forming a ferroelectric layer having at least a metal on the insulating layer and the first electrode, and (c3) forming at least a second electrode on the ferroelectric layer.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

First, it should be noticed that the positive temperature-coefficient-resistance (PTCR) of strontium-barium titanate $(Ba, Sr)TiO_3$, i.e. the BST material, always depends on the grain boundary in the BST material and the curie temperature thereof which is strongly influenced by the chemical composition, the dopant and the grain size thereof.

Figure 1:
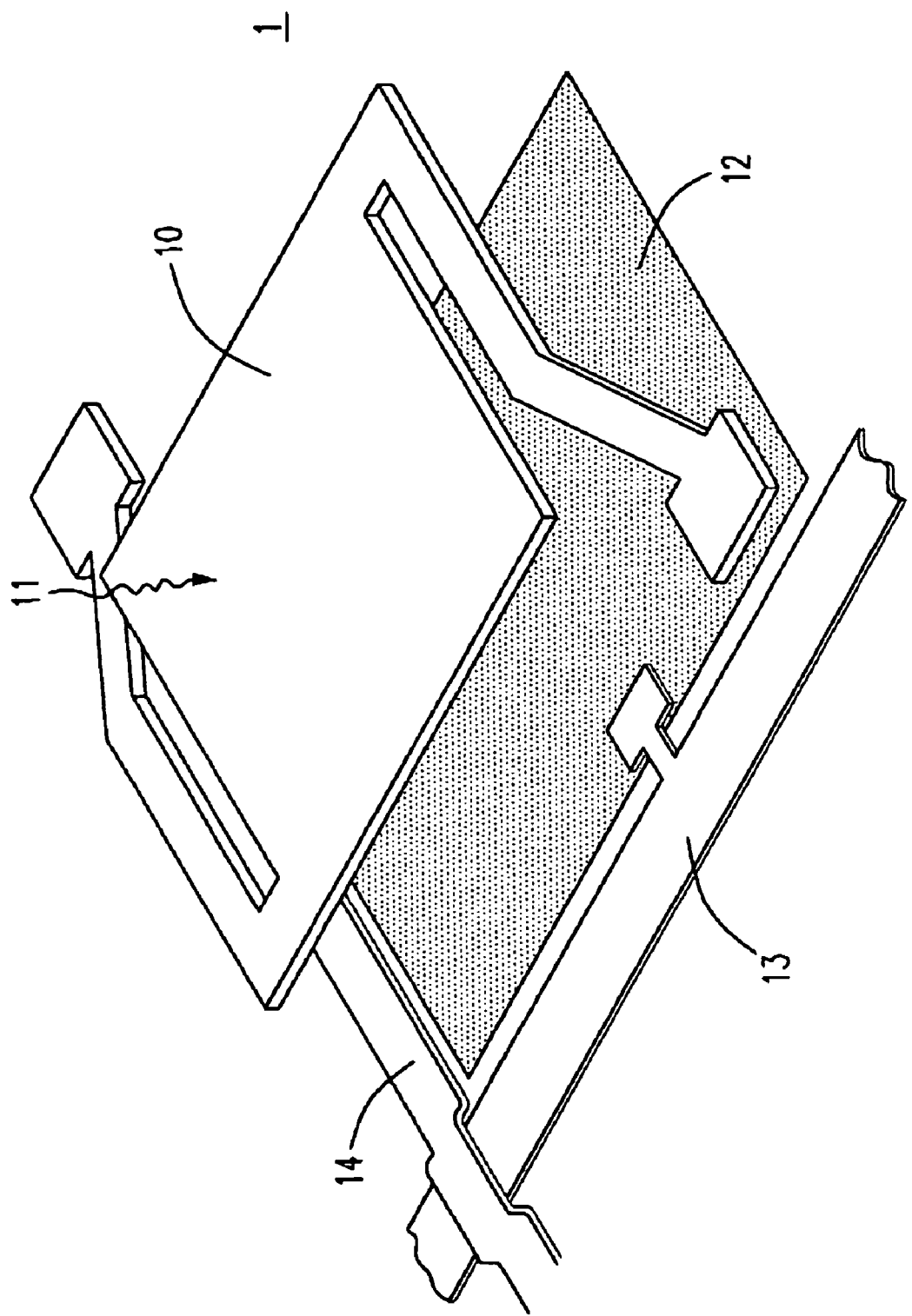
FIG. 1 is a side view schematically illustrating a conventional micro-thermistor device according to the prior art.
Figure 2:
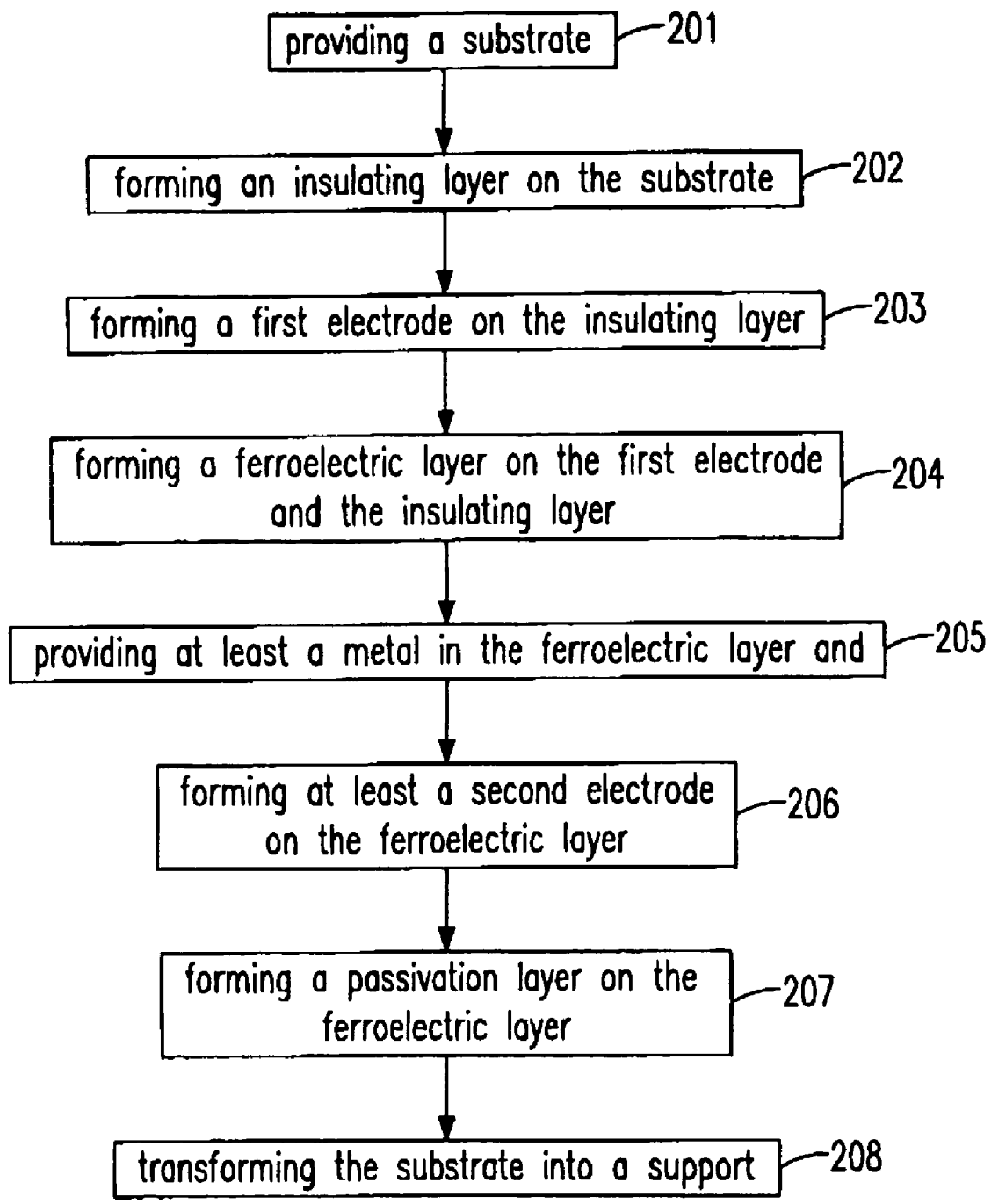
FIG. 2 is a flow chart schematically illustrating a method for fabricating a micro-thermistor device according to a preferred embodiment of the present invention.

Please refer to FIG. 2, which is a flow chart schematically illustrating a method for fabricating a micro-thermistor device according to a preferred embodiment of the present invention. First, a substrate is prepared and provided as shown in the step 201. Then, an insulating layer is formed on the substrate, on which a first electrode is further formed, as shown in the steps 202 and 203, respectively. A ferroelectric layer is subsequently fabricated on the first electrode and the insulating layer as shown in the step 204. Afterward, at least a metallic dopant is provided on the ferroelectric layer as shown in the step 205. In this embodiment, the metallic dopant is driven in the ferroelectric layer via a heat treatment, e.g. the microwave post-treatment or the excimer laser annealing treatment.

In a following step, a second electrode is formed on the ferroelectric layer as shown in the step 206. Besides, an optional step of forming a passivation layer is also preferred as shown in the step 207. Finally, the substrate processed as mentioned is transformed into a support and the micro-thermistor device is fabricated, as shown in the step 208.

In this embodiment, the provided substrate is made of silicon, and the insulating layer is made of silicon oxide or silicon nitride. Furthermore, the first and the second electrodes contain an electrically conductive ceramic material and a metal with a relatively high melting-point, e.g. platinum. The ferroelectric layer is a polycrystalline strontium-barium titanate (BST) layer and the metallic dopant includes a chromium (Cr) and a manganese (Mn). In addition, the first electrode, the ferroelectric layer and the second electrode are regarded as a thin film resistor in this case.

Figure 3A:
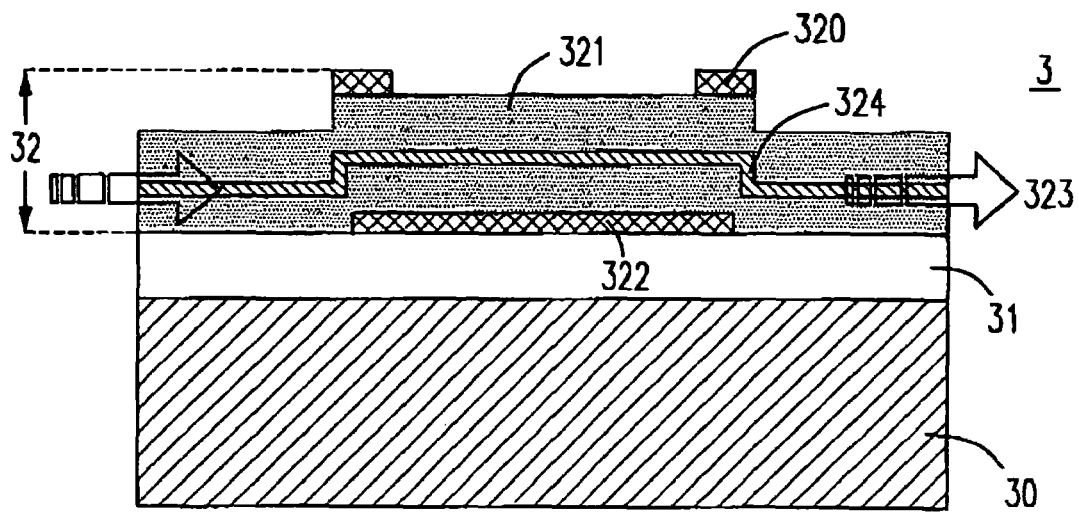
FIGS. 3(a) and 3(b) are side views schematically illustrating the micro-thermistor device according to the preferred embodiment of the present invention.
Figure 3B:
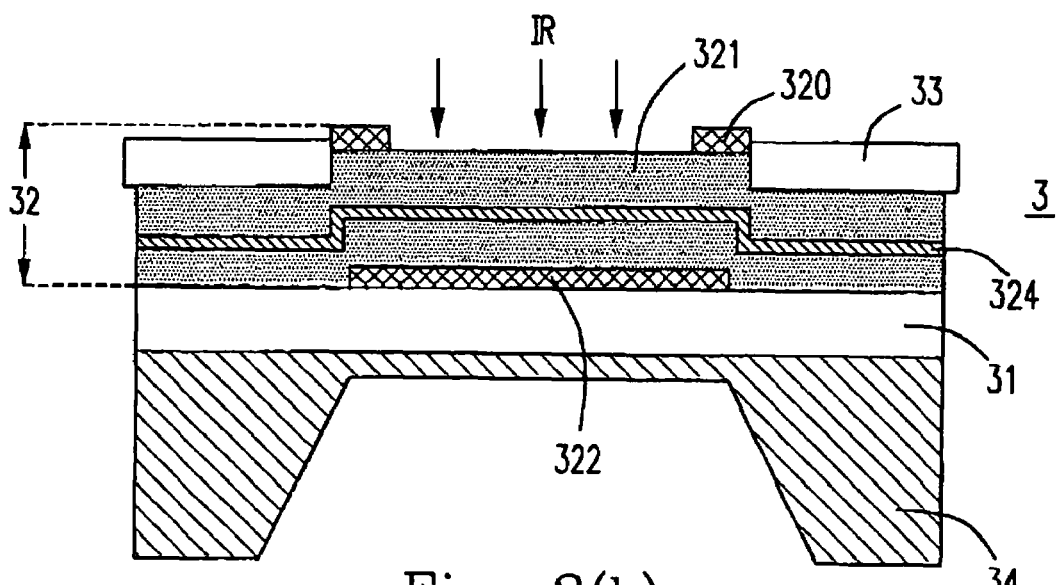

Please refer to FIGS. 3(a) and 3(b), which are side views schematically illustrating the micro-thermistor device according to the preferred embodiment of the present invention. The micro-thermistor 3 is constructed on a silicon substrate 30 on which an insulating layer 31 made of $SiO_2$ or $Si_3N_4$ is applied. The thin film resistor 32 composed of a top electrode 320, a ferroelectric layer 321 and a bottom electrode 322 is deposited on the insulating layer 31 via a low-temperature process in which the process including the RF sputtering or the pulsed-laser deposition (PLD) is performed at a temperature lower than 400° C. Preferably, the top electrode 320 as well as the bottom electrode 322 is made of an electrically conductive ceramic material or of a metal with a high melting-point, such as the platinum (Pt), so as to prevent the Schottky contact between the BST ferroelectric layer 321 and the top and bottom electrodes 320 and 322, respectively.

The provided micro-thermistor 3 is characterized in a superlattice thin film 324 of Cr or Mn in the ferroelectric layer 321. The hetero-element Cr or Mn is driven-in into the grain or the lattice sites of the ferroelectric layer 321. After performing a heat treatment, such as the microwave post-treatment or the excimer laser annealing, for the provided micro-thermistor 3 (as the arrow direction 323 in FIG. 3(a)), the superlattice thin film 324 of Cr or Mn is fabricated thereby, which can significantly enhance the PTCR of the provided micro-thermistor 3.

As shown in FIG. 3(b), the provided micro-thermistor 3 preferably includes a passivaiton layer 33 on the ferroelectric layer 321. After the provided micro-thermistor 3 is heating by means of the microwave post-treatment, the support 34 for the provided micro-thermistor 3 is transformed from the substrate 30 in FIG. 3(a) via bulk micromachining, so that the provided micro-thermistor 3 is able to be suspended on a main frame (not shown).

Based on the above, the present invention provides a novel microsensor, i.e. the micro thermistor, and a more simplified fabrication method therefor. By performing the microwave post-treatment, the metallic dopants Cr or Mn are driven-in into the grains of the perovskite-type BST thin film with a less interface stress and further form a supperlattice thin film therein, so as to significantly enhance PTCR of the provided micro-thermistor. In addition, the suspended structure of the provided PTCR micro-thermistor is much advantageous for reducing the thermal dissipation, enhancing the image resolution and shortening the response time in the image array application. Hence, the present invention not only has a novelty and a progressive nature, but also has an industry utility.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a microsensor, comprising steps of:
   (a) providing a substrate;
   (b) forming an insulating layer on said substrate;
   (c) forming a first electrode on said insulating layer;
   (d) forming a ferroelectric layer on said first electrode and said insulating layer;
   (e) providing at least a metal in said ferroelectric layer via one of a microwave post-treatment and an excimer laser annealing treatment; and
   (f) forming at least a second electrode on said ferroelectric layer.

2. The method according to claim 1, further comprising a step (g) of:
   transforming said substrate into a support.

3. The method according to claim 1, wherein each of the microwave post-treatment and the excimer laser annealing treatment is a heat treatment.

4. The method according to claim 1, further comprising a step (f1) of:
   forming a passivation layer on said ferroelectric layer.

5. The method according to claim 1, wherein said substrate comprises a silicon.

6. The method according to claim 1, wherein said insulating layer comprises one of a silicon oxide and a silicon nitride.

7. The method according to claim 1, wherein said first electrode and said second electrode comprise one of an electrically conductive ceramic material and a metal with a relatively high melting-point.

8. The method according to claim 7, wherein said metal with said relatively high melting-point is a platinum.

9. The method according to claim 1, wherein said ferroelectric layer is a polycrystalline barium strontium titanate (BST) layer.

10. The method according to claim 1, wherein said metal comprises one of a chromium and a manganese.

* * * * *